US 8,362,506 B2

(12) United States Patent
Rode et al.

(10) Patent No.: US 8,362,506 B2
(45) Date of Patent: Jan. 29, 2013

(54) OPTOELECTRONIC SEMICONDUCTOR BODY (75) Inventors: Patrick Rode, Regensburg (DE); Karl Engl, Niedergebraching (DE); Martin Strassburg, Tegernheim (DE); Lutz Hoeppel, Alteglofsheim (DE); Matthias Sabathil, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 255 days.

(21) Appl. No.: 12/678,259

(22) PCT Filed: Aug. 27, 2008

(86) PCT No.: PCT/DE2008/001424
§ 371 (c)(1),
(2), (4) Date: May 12, 2010

(87) PCT Pub. No.: WO2009/039812
PCT Pub. Date: Apr. 2, 2009

(65) Prior Publication Data
US 2010/0230698 A1    Sep. 16, 2010

(30) Foreign Application Priority Data
Sep. 28, 2007 (DE) .................. 10 2007 049 772
Apr. 29, 2008 (DE) .................. 10 2008 021 403

(51) Int. Cl.
*H01L 33/12* (2010.01)
*H01L 33/30* (2010.01)
(52) U.S. Cl. ........................................ 257/98
(58) Field of Classification Search ............ 257/E51.018 –E51.022, E33.001–E33.077, 13, 79–103, 257/918; 438/22–47, 69, 493, 503, 507, 438/956
See application file for complete search history.

(56) References Cited

U.S. PATENT DOCUMENTS

| | | | |
|---|---|---|---|
| 6,031,243 A * | 2/2000 | Taylor | 257/13 |
| 6,870,191 B2 | 3/2005 | Niki et al. | |
| 6,979,584 B2 * | 12/2005 | Koike et al. | 438/44 |
| 7,053,419 B1 | 5/2006 | Camras et al. | |
| 7,064,355 B2 | 6/2006 | Camras et al. | |
| 7,326,967 B2 | 2/2008 | Hsieh et al. | |
| 7,470,938 B2 | 12/2008 | Lee et al. | |
| 7,521,329 B2 | 4/2009 | Kwak et al. | |
| 7,560,725 B2 | 7/2009 | Koike et al. | |
| 7,635,875 B2 | 12/2009 | Niki et al. | |
| 7,642,561 B2 | 1/2010 | Lee et al. | |
| 7,648,849 B2 | 1/2010 | Lee et al. | |
| 7,655,959 B2 | 2/2010 | Lee et al. | |
| 2002/0030194 A1 | 3/2002 | Camras et al. | |

(Continued)

FOREIGN PATENT DOCUMENTS

DE    10 2005 031 612 A1    2/2006
EP          1 677 365 A2    7/2006

(Continued)

*Primary Examiner* — Dao H Nguyen
*Assistant Examiner* — Tram H Nguyen
(74) *Attorney, Agent, or Firm* — Slater & Matsil, L.L.P.

(57) ABSTRACT

An optoelectronic semiconductor body includes a substrate with a front side for emitting electromagnetic radiation. The optoelectronic semiconductor body has a semiconductor layer sequence that is arranged on a rear side of the substrate and has an active layer suitable for generating the electromagnetic radiation. The optoelectronic semiconductor body also includes first and second electrical connection layers that are arranged on a first surface of the semiconductor body that faces away from the substrate.

17 Claims, 8 Drawing Sheets

U.S. PATENT DOCUMENTS

| | | | |
|---|---|---|---|
| 2003/0057444 | A1 | 3/2003 | Niki et al. |
| 2003/0092263 | A1 | 5/2003 | Koike et al. |
| 2004/0189185 | A1* | 9/2004 | Yotsuya .................. 313/501 |
| 2005/0221521 | A1 | 10/2005 | Lee et al. |
| 2005/0285128 | A1* | 12/2005 | Scherer et al. ............. 257/98 |
| 2006/0006402 | A1 | 1/2006 | Hsieh et al. |
| 2006/0027831 | A1 | 2/2006 | Kioke et al. |
| 2006/0033113 | A1 | 2/2006 | Lee et al. |
| 2006/0118802 | A1 | 6/2006 | Lee et al. |
| 2006/0118803 | A1 | 6/2006 | Lee et al. |
| 2006/0157719 | A1 | 7/2006 | Kwak et al. |
| 2007/0166862 | A1 | 7/2007 | Kim et al. |
| 2008/0064133 | A1 | 3/2008 | Lee et al. |
| 2008/0210969 | A1 | 9/2008 | Yuan et al. |
| 2008/0303043 | A1 | 12/2008 | Niki et al. |
| 2008/0308835 | A1* | 12/2008 | Pan ........................ 257/103 |
| 2009/0026385 | A1* | 1/2009 | Knight et al. ............ 250/432 R |
| 2009/0042328 | A1 | 2/2009 | Niki et al. |
| 2009/0166658 | A1* | 7/2009 | Slater et al. ................ 257/98 |
| 2010/0075452 | A1 | 3/2010 | Lee et al. |
| 2010/0081221 | A1 | 4/2010 | Lee et al. |

FOREIGN PATENT DOCUMENTS

| | | |
|---|---|---|
| EP | 1 798 780 A2 | 6/2007 |
| TW | 558844 B | 10/2003 |
| WO | WO-2007/037762 A1 | 4/2007 |

* cited by examiner

OPTOELECTRONIC SEMICONDUCTOR BODY

This patent application is a national phase filing under section 371 of PCT/DE2008/001424, filed Aug. 27, 2008, which claims the priority of German patent applications 10 2007 049 772.7, filed Sep. 28, 2007 and 10 2008 021 403.5, filed Apr. 29, 2008, each of which is incorporated herein by reference in its entirety.

TECHNICAL FIELD

The present invention relates to an optoelectronic semiconductor body.

BACKGROUND

Optoelectronic semiconductor bodies typically have an active layer suitable for generating electromagnetic radiation. The optoelectronic semiconductor has two terminals for applying an electrical potential. A first terminal is frequently arranged on a first side of the active layer and a second terminal is arranged on a second side of the active layer. Therefore a first side and a second side of the active layer are contacted.

SUMMARY

In one embodiment, an optoelectronic semiconductor body includes a substrate with a front side and a rear side. The front side of the substrate is provided for emitting electromagnetic radiation. The optoelectronic semiconductor body further includes a semiconductor layer sequence as well as a first and second connection layer. The semiconductor layer sequence is arranged on the rear side of the substrate. The semiconductor layer sequence has an active layer suitable for generating the electromagnetic radiation. The first and the second electrical connection layers are arranged on a first surface of the semiconductor layer sequence that faces away from the substrate.

The rear side of the substrate can be the underside of the substrate. The underside of the substrate can be that side of the substrate that is facing a connection lead during the mounting of the semiconductor body. The front side of the substrate can be the upper side of the substrate.

The semiconductor layer sequence can be grown epitaxially. The semiconductor layer sequence can be deposited epitaxially on the substrate.

Since the two electrical connection layers are situated on the first surface of the semiconductor layer sequence facing away from the substrate, an emission of electromagnetic radiation via a front side of the optoelectronic semiconductor body, and the supply of electrical energy for the active layer via a rear side of the semiconductor body, can be possible. Thus the two electrical connection layers do not impede the outcoupling of radiation via the front side, so that a high outcoupling efficiency is achieved. The front side of the substrate preferably forms a front side of the optoelectronic semiconductor body. On the other hand, the two electrical connection layers can form a rear side of the optoelectronic semiconductor body.

The substrate can be a lattice-matched substrate. In that case it is matched to a crystal lattice of the semiconductor layer sequence. This simplifies an epitaxial deposition of the semiconductor layer sequence on the substrate. In particular, the substrate is matched to a first layer of the semiconductor layer sequence that is deposited on the rear side of the substrate.

In one embodiment, the semiconductor body, for example, the substrate and/or the semiconductor layer sequence, contains a nitride compound semiconductor. Containing a nitride compound semiconductor can mean that the semiconductor body, particularly the substrate and/or the semiconductor layer sequence, includes a nitride-III compound semiconductor material, preferably $Al_nGa_mIn_{1-n-m}N$, where $0 \leq n \leq 1$, $0 \leq m \leq 1$ and $n+m \leq 1$. This material need not necessarily have a mathematically exact composition according to the above formula. Instead, it can have one or more dopants as well as additional constituents that do not substantially change the characteristic physical properties of the $Al_nGa_nIn_{1-n-m}$ N material. For the sake of simplicity, however, the above formula contains only the essential constituents of the crystal lattice, Al, Ga, In and N, even if these can be replaced in part by slight amounts of additional materials.

In one embodiment, the substrate contains a first nitride compound semiconductor. The semiconductor layer sequence contains a second nitride compound semiconductor.

In one embodiment, the first and the second nitride compound semiconductors are different. In an alternative embodiment, the first and the second nitride compound semiconductors are the same. By using a nitride compound semiconductor both for the substrate and for the semiconductor layer sequence, the substrate is well matched to the semiconductor layer sequence.

The substrate can contain crystalline gallium nitride. The substrate is preferably formed as a gallium nitride monocrystal. By depositing a gallium nitride-based epitaxial layer onto the substrate containing gallium nitride, a refractive index discontinuity between substrate and semiconductor layer sequence can be kept small or avoided. A waveguide effect at the rear side of the substrate can be reduced or avoided in that way. Due to the homoepitaxial deposition, the number of dislocations in the semiconductor layer sequence is minimized. The dislocation density can be markedly less than $10^7$ dislocations per square centimeter.

In an alternative embodiment, the substrate includes an auxiliary carrier, preferably a crystalline auxiliary carrier that is arranged towards the front side of the substrate, particularly on the front side of the substrate. The semiconductor layer sequence contains a nitride compound semiconductor. Preferably, the nitride compound semiconductor is realized as an aluminum indium gallium nitride compound semiconductor according to the formula above. The semiconductor layer sequence is heteroepitaxially deposited on the rear side of the substrate. The auxiliary carrier can be crystalline. The auxiliary carrier can be formed as a growth substrate. The auxiliary carrier can preferably contain a material that differs from a material of the semiconductor layer sequence based on a nitride compound semiconductor. By using the auxiliary carrier, a cost effective production of the optoelectronic semiconductor body is facilitated.

In one refinement, the auxiliary carrier includes crystalline aluminum oxide $Al_2O_3$. The auxiliary carrier is preferably realized as an aluminum oxide monocrystal. An aluminum oxide monocrystal is typically referred to as sapphire.

In one refinement, the rear side of the substrate is realized in such a manner that the effects of a difference of the refractive index in the auxiliary carrier and the semiconductor layer sequence are reduced. The radiation yield is thereby further increased.

In one refinement, a first main surface of the auxiliary carrier is pre-structured. The first main surface of the auxiliary carrier faces the semiconductor layer sequence and therefore faces away from the front side of the substrate. Such a pre-patterned substrate, abbreviated PPS, can facilitate an epitaxial deposition of the semiconductor layer sequence.

In one embodiment, the substrate can have a nucleation layer that is arranged, and in particular deposited, on the first main surface of the auxiliary carrier. The nucleation layer can be constructed as a structured nucleation layer. The nucleation layer can have lateral structures with dimensions in an interval between 5 nm and 100 nm. The nucleation layer preferably includes structures with lateral and vertical dimensions in an interval between 5 nm and 100 nm. A typical value for a dimension is 30 nm. The nucleation layer can contain a metal. Because of the small dimensions of the nucleation layer, surface plasmons can occur in the nucleation layer.

In one refinement, the substrate can have a buffer layer that is arranged, and in particular deposited, on the first main surface of the auxiliary carrier. The buffer layer can optionally be arranged, and in particular deposited, on the nucleation layer. The buffer layer can contain a dielectric layer. The dielectric layer can contain silicon oxide or silicon nitride, abbreviated $SiO_x$ and $SiN_x$, respectively. Alternatively or additionally, the buffer layer contains aluminum gallium nitride and/or gallium nitride. The buffer layer can contain an aluminum gallium nitride-gallium nitride junction, abbreviated AlGaN—GaN junction. The AlGaN—GaN junction can be epitaxially deposited. The buffer layer can form a rear side of the substrate that is matched to the semiconductor layer sequence, so that a semiconductor layer sequence can be epitaxially deposited and a high radiation yield can be achieved.

In a refinement, the buffer layer is structured. The vertical and lateral dimensions of the buffer layer can lie in an interval between 5 nm and 5 μm. The lateral and vertical dimensions of the buffer layer are preferably from an interval between 60 nm and 500 nm. The buffer layer can have a roughened structure. The roughened structure can be irregular.

The buffer layer is optionally realized as a periodic lattice structure.

In a refinement, the semiconductor layer sequence or a first layer of the semiconductor layer sequence is deposited by the method of structuring the epitaxy on the rear side of the substrate. For this purpose, for example, the auxiliary carrier, the nucleation layer and/or the buffer layer can have a structure. The first layer of the semiconductor layer sequence is arranged on the rear side of the substrate. The first layer can optionally be structured. By structuring the epitaxy, structures with lateral and vertical dimensions in an interval between 5 nm and 5 μm can be realized. The first layer can be realized as a roughened structure or as a periodic grating structure. The lateral and vertical dimensions of the structures are preferably in an interval between 60 nm and 500 nm. The method for structuring the epitaxy can be configured as a method for structured epitaxy or as a method for selective epitaxy or as a method for epitaxial overgrowth. The method for epitaxial overgrowth is also known as epitaxial lateral overgrowth, abbreviated ELOG. In the ELOG method, the epitaxial deposition starts at individual points on the substrate. The epitaxial layer, originally present only in the form of islands, closes up in the course of the epitaxial process into a contiguous epitaxial layer, which constitutes the first layer. In this process, the areas between the points at which the growth of the epitaxial layer started are overgrown. The interstices that are laterally overgrown can be formed by a mask layer. Thus the epitaxial layer has a structure at least on the substrate side.

By means of the above embodiments of the substrate with an auxiliary carrier, a lattice matching between a lattice of the auxiliary carrier and a lattice of the semiconductor layer sequence is achieved. Thus the level of the dislocation density otherwise occurring in case of lattice mismatches is reduced. Such dislocations can act as non-radiating recombination centers. The efficiency of the semiconductor body is increased by avoiding dislocations. In addition, the effects of a difference in refractive index between the auxiliary carrier and the semiconductor layer sequence can be reduced. The rear side of the substrate can be constructed such that an index of refraction of the auxiliary carrier is matched to an index of refraction of the semiconductor layer sequence.

In one embodiment, the optoelectronic semiconductor body includes an outcoupling structure. The outcoupling structure is arranged on the front side of the substrate. The outcoupling structure can include layers that are applied to the front side of the substrate.

In one refinement, the substrate includes the outcoupling structure. According to the refinement, the outcoupling structure is realized in the substrate. Thus the electromagnetic radiation is emitted from the front side of the substrate through the outcoupling structure, so that the angle-dependency of the intensity of the electromagnetic radiation can be adjusted.

In a preferred refinement, a nitride compound semiconductor, in particular, gallium nitride, is used for the substrate including the outcoupling structure. The structures necessary for the outcoupling structure, in particular, the recesses, can be etched into the substrate. The outcoupling structure can be efficiently produced in the substrate, since a nitride compound semiconductor can be easily structured by dry or wet chemical etching.

In one refinement, the optoelectronic semiconductor body includes a mirror, in particular, a dielectric mirror, which is arranged on the first surface, facing away from the substrate, of the semiconductor layer sequence. The mirror is preferably arranged, at least in certain areas, between the semiconductor layer sequence and the first and/or second electrical connection layer. By means of the mirror, a portion of the electromagnetic radiation emitted by the active layer is reflected in the direction of the front side of the substrate. The radiation outcoupling is thereby increased.

In one embodiment, the mirror has a dielectric layer and a metal layer. The dielectric layer is deposited on the semiconductor layer sequence. The dielectric layer can contain, for example, silicon oxide or silicon nitride, abbreviated $SiO_x$ and $SiN_x$, respectively. The metal layer serves as a reflector. The metal layer can contain aluminum (Al), silver (Ag), platinum (Pt), titanium (Ti), titanium-tungsten (TiW), titanium-tungsten nitride (TiWN), or an alloy. The alloy preferably contains one of the metals or metal compounds.

In one refinement, the dielectric layer and the metal layer have at least one recess, so that the first and/or second electrical connection layer are arranged in the at least one recess on a layer of the semiconductor layer sequence. Thus, an electrically conductive contact of the first and/or second electrical connection layer with the semiconductor layer sequence is achieved. A through-connection through the mirror is thereby produced.

An adhesion-promoting layer can be arranged between the dielectric layer and the metal layer of the mirror. The adhesion-promoting layer can contain a metal such as platinum, titanium, titanium-tungsten or titanium-tungsten nitride. A thickness of the adhesion-promoting layer can be less than or equal to 5 nm, preferably less than or equal to 1 nm. Titanium-tungsten and titanium-tungsten nitride are additionally usable as a diffusion barrier. Platinum has good properties both as a diffusion barrier and as a reflector.

In one embodiment, the first and/or second electrical connection layer has a multilayer structure.

In one embodiment, the first and/or second electrical connection layer has a transparent conductive oxide. Transparent conductive oxides, abbreviated TCO, are transparent electrically conductive materials, generally metal oxides such as zinc oxide, tin oxide, cadmium oxide, titanium oxide, indium oxide, indium-zinc oxide or indium-tin oxide, abbreviated ITO. In addition to binary metal-oxygen compounds such as ZnO, $SnO_2$ or $In_2O_3$, tertiary metal-oxygen compounds such as $Zn_2SnO_4$, $CdSnO_3$, $ZnSnO_3$, $MgIn_2O_4$, $GaInO_3$, $Zn_2In_2O_5$ or $In_4Sn_3O_{12}$ or mixtures of various transparent conductive oxides belong to the group of TCOs. Furthermore, the transparent conductive oxides do not necessarily correspond to a stoichiometric composition and can be p-doped or n-doped. Such a transparent conductive oxide can preferably contain indium tin oxide or indium zinc oxide. A current spreading in the first and/or second electrical connection layer is achieved by means of the transparent conductive oxide.

The optoelectronic semiconductor body can be realized as a light-emitting diode, in particular, as a thin-film light-emitting diode chip and, in particular, the electromagnetic radiation can be visible light.

In one embodiment, a method for manufacturing an optoelectronic semiconductor body includes the provision of a substrate that includes a front side for emission of electromagnetic radiation and a rear side. A semiconductor layer sequence is epitaxially deposited on the rear side of the substrate. The semiconductor layer sequence includes an active layer suitable for generating the electromagnetic radiation. A first and a second electrical connection layer are deposited on a first surface of the semiconductor layer sequence facing away from the substrate.

The optoelectronic semiconductor body is preferably realized as an optoelectronic semiconductor body that is contactable from one side. Because of the contacting from a rear side of the optoelectronic semiconductor body, the radiation outcoupling on a front side of the optoelectronic semiconductor body is very efficient. The optoelectronic semiconductor body can thus be applied in flipchip technology to a carrier body, in particular, a circuit board or a housing.

BRIEF DESCRIPTION OF THE DRAWINGS

The invention will be described in detail below for several embodiments with reference to the figures. Layers, regions and structures with identical function or effect have identical reference numbers. Insofar as layers, regions or structures correspond to one another in function, a description of them will not be repeated in each of the following figures.

In the drawings.

DETAILED DESCRIPTION OF ILLUSTRATIVE EMBODIMENTS

Figure 1A:
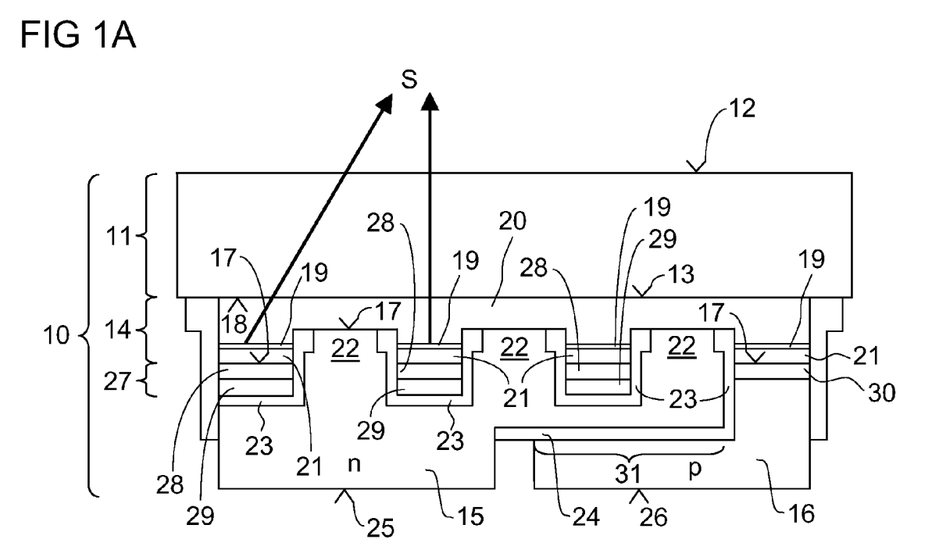
FIGS. 1A and 1B show exemplary embodiments of an optoelectronic semiconductor body according to the proposed principle.

FIG. 1A shows an exemplary embodiment of an optoelectronic semiconductor body according to the proposed principle. The optoelectronic semiconductor body 10 includes a substrate 11 with a front side 12 and a rear side 13. Optoelectronic semiconductor body 10 further includes a semiconductor layer sequence 14 as well as a first and second electrical connection layer 15, 16. The semiconductor layer sequence 14 is arranged on the rear side 13 of substrate 11. Semiconductor layer sequence 14 has a first and second surface 17, 18. First surface 17 of semiconductor layer sequence 14 faces away from substrate 11. On the other hand, second surface 18 of semiconductor layer sequence 14 is arranged on rear side 13 of substrate 11. First and second electrical connection layers 15, 16 are arranged on first surface 17 of semiconductor layer sequence 14. Semiconductor layer sequence 14 further includes an active layer 19, at least one n-type layer 20 and at least one p-type layer 21. The at least one n-type layer 20 is arranged between active layer 19 and substrate 11, or between active layer 19 and second surface 18 of semiconductor layer sequence 14. The at least one p-type layer 21 is arranged between active layer 19 and first surface 17 of semiconductor layer sequence 14.

Rear side 13 of substrate 11 can be the underside of substrate 11. The underside of substrate 11 can be that side of substrate 11 that is facing a connection lead during the mounting of semiconductor body 10. Front side 12 of substrate 11 can be the upper side of substrate 11.

P-type layer 21 and active layer 19 include several recesses 22. The recesses 22 are for connecting first connection layer 15 to n-type layer 20. First connection layer 15 has several electrically conductive contacts with n-type layer 20. Three contacts of electrically conductive connection layer 15 with n-type layer 20 are shown in FIG. 1A. Second electrically conductive connection layer 16 further includes a contact with p-type layer 21. A first insulator layer 23 is arranged on the side walls of recesses 22 and on p-type layer 21 in certain areas. First electrical connection layer 15 is arranged on n-type layer 20 in recesses 22 and on first insulator layer 23. In certain areas, a second insulator layer 24 is arranged on first electrical connection layer 15. Second electrical connection layer 16 is arranged on second insulator layer 24 and on p-type layer 21. In a region 31, first connection layer 15 is arranged between semiconductor layer sequence 14 and second connection layer 16. In the region 31, first connection layer 15 is electrically insulated via second insulator layer 24 from second connection layer 16.

First and second electrical connection layers 15, 16 have a first and a second connection surface 25, 26. First and second connection surfaces 25, 26 are arranged approximately in a plane. The two connection surfaces 25, 26 are arranged closer to first surface 17 of semiconductor layer sequence 14 than to second surface 18. A mirror 27 is arranged between p-type layer 21 and first insulator layer 23. Mirror 27 includes a dielectric layer 28 and a metal layer 29. Dielectric layer 28 is deposited on first surface 17 of semiconductor layer sequence 14 in certain areas. Metal layer 29 is in turn arranged on dielectric layer 28. Second electrical connection layer 16 contains a transparent conductive oxide 30 in a region in which it is arranged on p-type layer 21. Transparent conductive oxide 30 is formed as a layer. Substrate 11 contains a crystalline gallium nitride. Substrate 11 is realized as gallium nitride monocrystal. Semiconductor layer sequence 14 contains a nitride compound semiconductor. Semiconductor layer sequence 14 includes a gallium nitride or an indium-gallium nitride compound semiconductor.

First and second electrical connection layers 15, 16 are connectable from a rear side of optoelectronic semiconductor body 10. An electrical potential is applied to active layer 19 by means of first electrical connection layer 15 and n-type layer 20, as well as second electrical connection layer 16 and p-type layer 21. The voltage drop across active layer 19 generates an electromagnetic radiation S, which passes in a first component through n-type layer 20 and substrate 11 and is emitted at front side 12 of substrate 11. A second component of the electromagnetic radiation is emitted from active layer 19 in the direction of first surface 17 of semiconductor layer sequence 14. A part of the second component of the electromagnetic radiation is reflected from mirror 27, so that this part also exits at front side 12 of substrate 11.

The n-type layer 20 is multiply contacted via the several recesses 22, so that a low-ohmic connection of first connection surface 25 to n-type layer 20 is achieved. The interlayer contacts through p-type layer 21 have the effect that first and second connection surfaces 25, 26 are arranged on the rear side of optoelectronic semiconductor body 10, facing away from substrate 11, so that they can be easily mounted on a carrier (not shown), e.g., a housing. Thus, radiation can exit at front side 12 without hindrance by any electrical contact of optoelectronic semiconductor body 10 with a housing, so that the radiation yield is increased and optoelectronic semiconductor body 10 can be housed cost-effectively. The radiation yield is further increased by means of mirror 27.

Figure 1B:
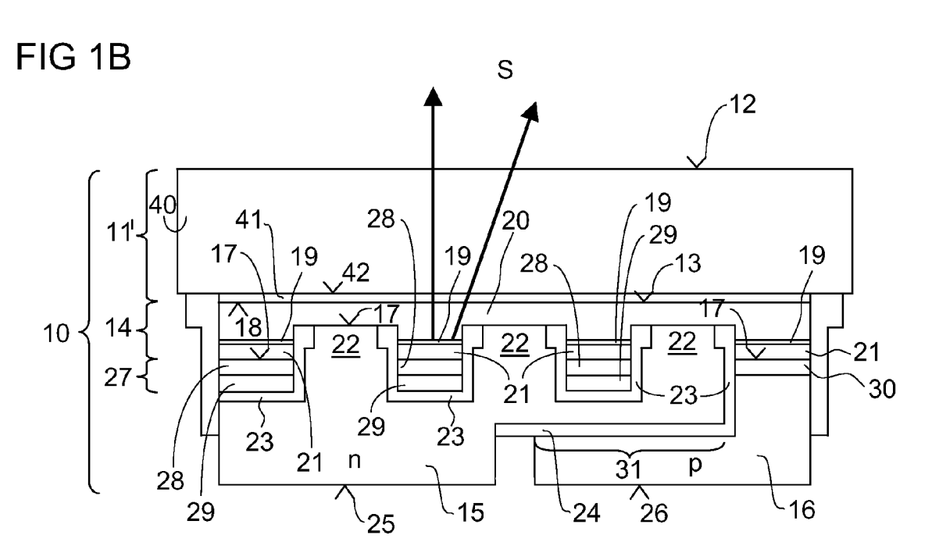

FIG. 1B shows an additional exemplary embodiment of an optoelectronic semiconductor body according to the proposed principle. Semiconductor layer sequence 14, first and second electrical connection layers 15, 16, first and second insulator layers 23, 24, mirror 27, as well as transparent conductive oxide 30 are realized as in FIG. 1A. Differing from the exemplary embodiment sown in FIG. 1A, substrate 11' of optoelectronic semiconductor body 10 according to FIG. 1B has an auxiliary carrier 40. Auxiliary carrier 40 is arranged on the front side 12 of substrate 11. Auxiliary carrier 40 is formed as a crystalline auxiliary carrier. Auxiliary carrier 40 contains crystalline aluminum oxide. Substrate 11' further includes a buffer layer 41 that is arranged between auxiliary carrier 40 and rear side 13 of substrate 11'. Buffer layer 41 can also be realized as an outcoupling layer. Buffer layer 41 contains aluminum-gallium nitride or gallium nitride. Buffer layer 41 is arranged on a first main surface 42 of auxiliary carrier 40. First main surface 42 is the main surface of auxiliary carrier 40 that faces semiconductor layer sequence 14.

Substrate 11' and auxiliary carrier 40 are transparent to the electromagnetic radiation S. Substrate 11' is matched by means of buffer layer 41 to semiconductor layer sequence 14. Thus the effect of a discontinuity in the index of refraction between semiconductor layer sequence 14 and substrate 11' is reduced, so that the radiation yield at front side 12 is high. A matching of the crystal lattice constant of auxiliary carrier 40 to the crystal lattice constant of semiconductor layer sequence 14 additionally takes place with buffer layer 41, so that a dislocation density is reduced and thus the radiation yield is likewise increased.

Auxiliary carrier 40 is preferably formed as an aluminum oxide monocrystal.

In an alternative embodiment, buffer layer 41 contains a dielectric layer. The dielectric layer can contain, for example, silicon oxide or silicon nitride.

In place of buffer layer 41, a nucleation layer can be applied to main surface 42 in an alternative embodiment (not shown). The nucleation layer can form a first monocrystalline surface.

A nucleation layer can be arranged between main surface 40 and buffer layer 41 in an alternative embodiment (not shown). Buffer layer 41 can facilitate the lattice matching of the nucleation layer to semiconductor layer sequence 14.

FIGS. 2A-2D show a total of four exemplary embodiments of an optoelectronic semiconductor body with different outcoupling structures according to the proposed principle. The embodiments shown in FIGS. 2A-2D are a refinement of the embodiments shown in FIGS. 1A and 1B. Semiconductor layer sequence 14, first and second electrical connection layers 15, 16, first and second insulator layers 23, 24, mirror 27, as well as the transparent conductive oxide 30 of the embodiments shown in FIGS. 2A-2D correspond to the respective layers in FIGS. 1A and 1B, and will thus not be explained below.

A cross section and a plan view onto front side 12 of substrate 11 are shown in each of the FIGS. 2A-2D. Substrate 11 is formed as a rectangle. According to FIGS. 2A-2D, substrate 11 includes a respective outcoupling structure 50. Outcoupling structure 50 is formed in substrate 11.

Figure 2A:
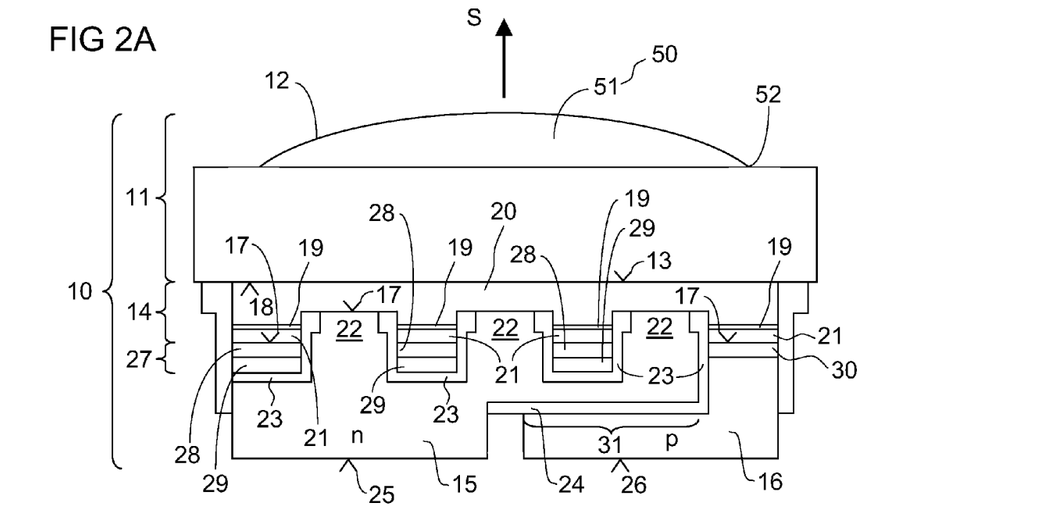
FIGS. 2A-2D show additional exemplary embodiments of an optoelectronic semiconductor body with an outcoupling structure according to the proposed principle.

According to FIG. 2A, outcoupling structure 50 is realized as a microlens 51. Microlens 51 is delimited by a circular line 52. A diameter D of circular line 52 is less than a first side length SL1 and less than a second side length SL2 of the rectangle of substrate 11.

Microlens 51 concentrates the electromagnetic radiation S, so that it exits with high intensity in a direction orthogonal to front side 12 of substrate 11. Substrate 11 contains, for example, a nitride compound semiconductor, since a microlens 51 can be etched with low technical expenditure into such a compound semiconductor. A dry etching method is used for the etching.

Figure 2B:
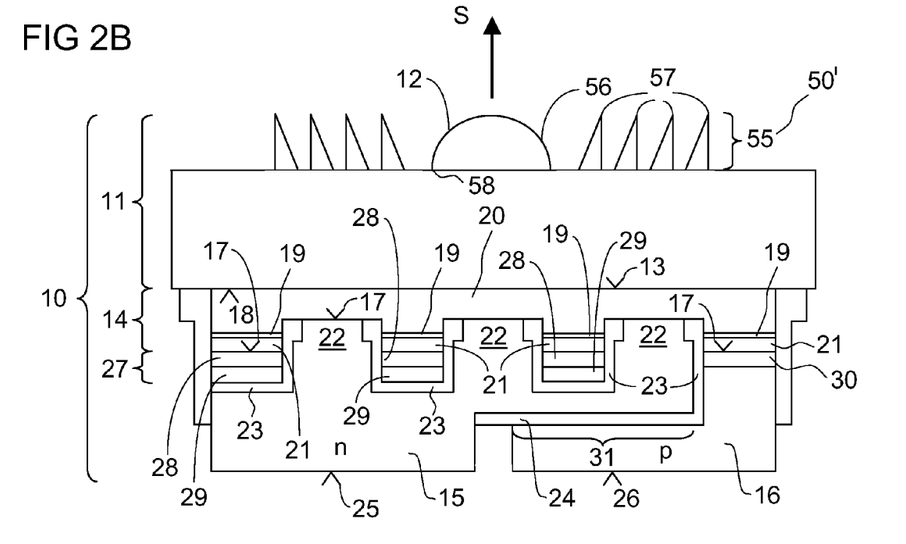

According to FIG. 2B, outcoupling structure 50' includes a diffractive optical element 55, abbreviated DOE. Diffractive optical element 55 is realized in substrate 11. Diffractive optical element 55 includes a microlens 56, about which several lines 57 are arranged. Microlens 56 has an elliptical border 58. Correspondingly, lines 57 around microlens 56 are realized as ellipses. The lines 57 have a triangular cross section.

A substantially planar structure that concentrates the electromagnetic radiation S in a direction orthogonal to substrate 11 is realized by means of diffractive optical element 55.

Figure 2C:
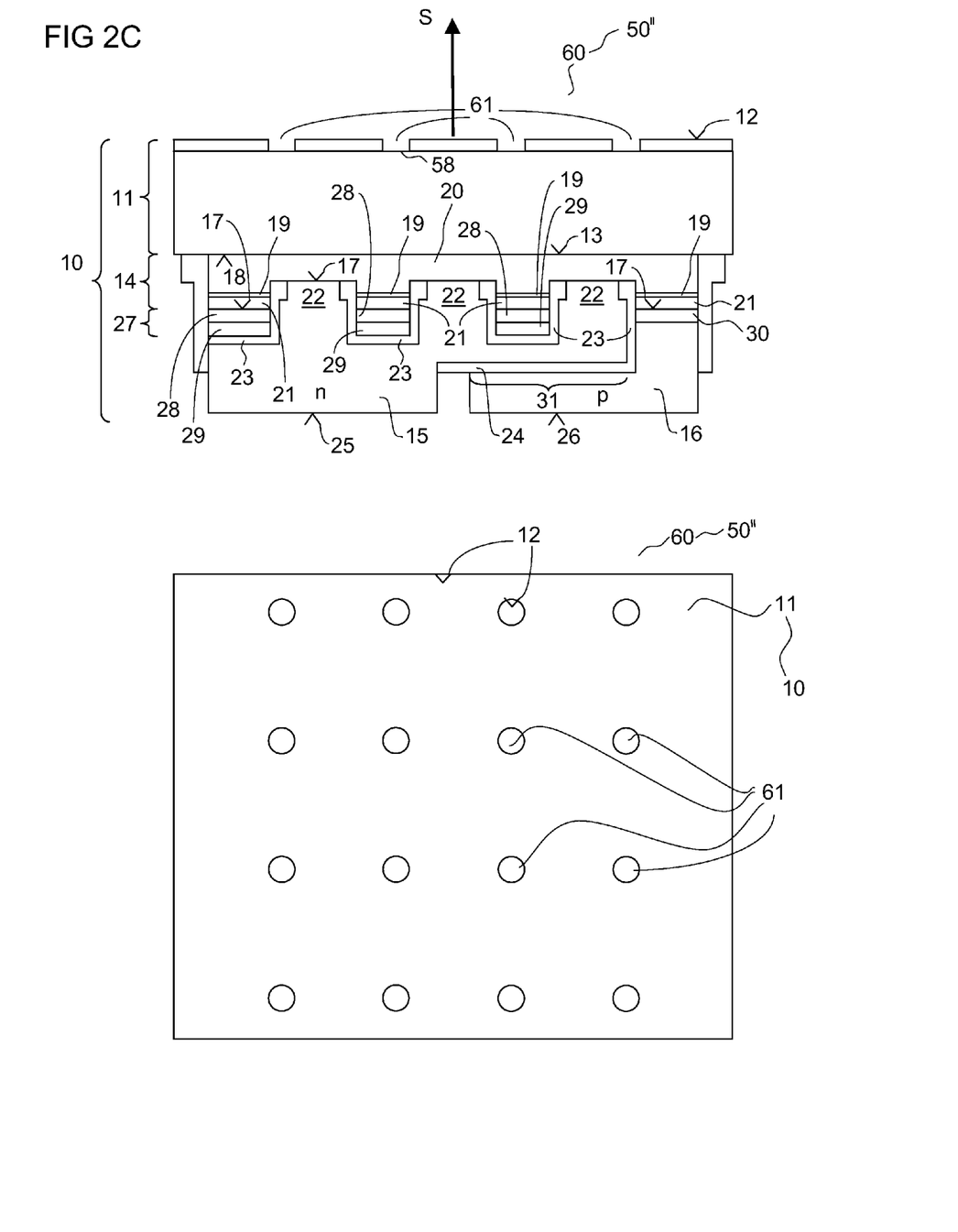

According to FIG. 2C, the outcoupling structure 50" is realized as a photonic crystal 60, PhC for short. Photonic crystal 60 is formed in substrate 11. For this purpose, recesses 61 are etched into substrate 11 on front side 12. The recesses 61 are circular in a plan view. The recesses 61 are arranged in a regular pattern. According to the embodiment as shown in FIG. 2C, the photonic crystal includes an arrangement of four by four recesses 61.

Figure 2D:
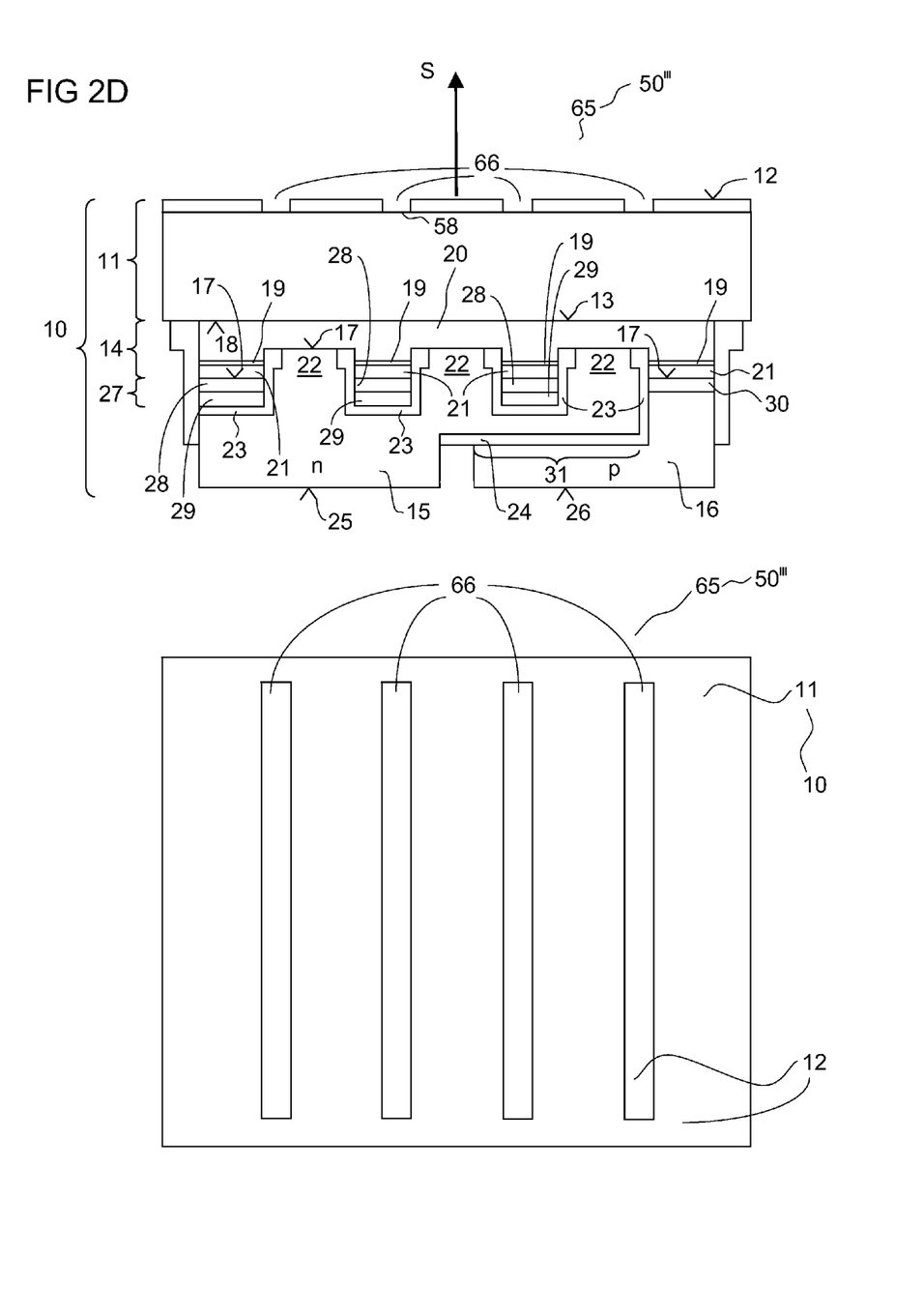

According to FIG. 2D, outcoupling structure 50''' is realized as a grating 65. For this purpose, strip-like recesses 66 are etched into substrate 11. The strip-like recesses 66 are formed as rectangles in a plan view. The strip-like recesses 66 are arranged in parallel to one another. Grating 65 is thus formed in substrate 11.

Therefore a direction-dependency of the electromagnetic radiation S can be produced by means of lattice 65.

Alternatively, the substrate can comprise auxiliary carrier 40, which has the respective outcoupling structure 50. According to this embodiment, the outcoupling structure 50 is formed in auxiliary carrier 40.

FIGS. 3A-3C, 4A-4C, and 5A-5C show several exemplary embodiments of an optoelectronic semiconductor body in which a structured epitaxy is carried out according to the proposed principle. The embodiments shown in the figures are a refinement of the embodiment shown in FIG. 1B. Substrate 11' thus includes auxiliary carrier 40. Optoelectronic semiconductor body 10 further includes semiconductor layer sequence 14, first and second electrical connection layers 15, 16, mirror 27, first and second insulator layers 23, 24, as well as transparent conductive oxide 30 corresponding to FIGS. 1A and 1B. First and second electrical connection layers 15, 16, mirror 27, first and second insulator layers 23, 24 as well as transparent conductive oxide 30 are not illustrated in FIGS. 3A-3C, 4A-4C and 5A-5C for the sake of clarity, and were already explained in detail based on FIG. 1A.

Figure 3A:
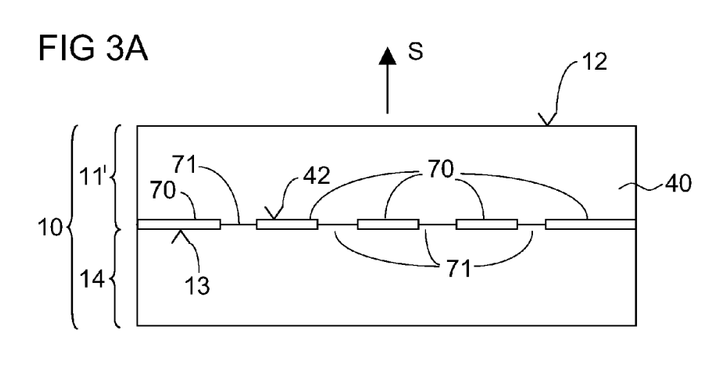
FIGS. 3A-3C show exemplary embodiments of an optoelectronic semiconductor body with a structured nucleation layer according to the proposed principle.

FIG. 3A shows an exemplary embodiment of an optoelectronic semiconductor body 10 according to the proposed principle in which substrate 11' includes a nucleation layer 70. Nucleation layer 70 is arranged on first main surface 42 of auxiliary carrier 40. Thus, nucleation layer 70 is arranged between auxiliary carrier 40 and semiconductor layer sequence 14. Nucleation layer 70 has structures that are formed as recesses 71. Recesses 71 serve to achieve a structuring of nucleation layer 70 and thus for performing structured epitaxy. Semiconductor layer sequence 14 is deposited on nucleation layer 70 and on auxiliary carrier 40 at the points where nucleation layer 70 is removed. The nucleation layer 70 has a thickness from an interval between 1 nm and 1 μm. A typical thickness of nucleation layer 70 is 25 nm. Nucleation layer 70 can also be referred to as a growth-starting layer. Nucleation layer 70 contains a compound semiconductor. The compound semiconductor is a nitride compound semiconductor. The compound semiconductor layer can be made of gallium nitride or aluminum nitride, for example. Nucleation layer 70 can have a rough surface.

To produce the cross section shown in FIG. 3A, nucleation layer 70 is deposited on auxiliary carrier 40. Subsequently, nucleation layer 70 is structured in a photolithography step and an etching step. Then semiconductor layer sequence 14 is epitaxially deposited. Nucleation layer 70 facilitates the growth of semiconductor layer sequence 14 on auxiliary carrier 40.

Figure 3B:
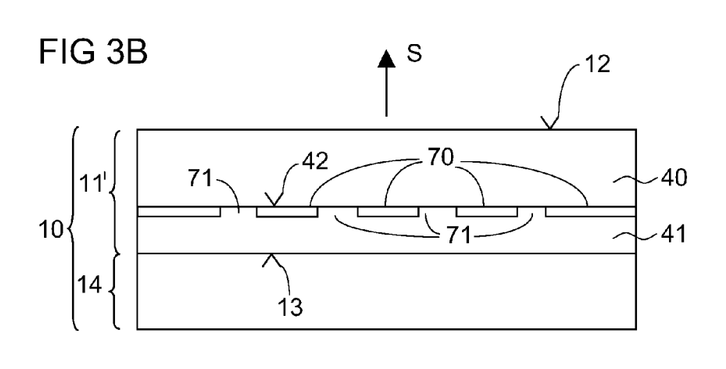

FIG. 3B shows an alternative embodiment of the optoelectronic semiconductor body. In contrast to FIG. 3A, substrate 11' additionally has the buffer layer 41. Buffer layer 41 is deposited on the structured nucleation layer 70 shown in FIG. 3A or on auxiliary carrier 40 at the points where nucleation layer 70 has been removed. Semiconductor layer sequence 14 is in turn arranged on buffer layer 41. According to this embodiment, structured nucleation layer 70 and buffer layer 41 serve for lattice matching between auxiliary carrier 40 and semiconductor layer sequence 14. Due to the structuring of nucleation layer 70, the waveguide effect at the junction between semiconductor layer sequence 14 and auxiliary carrier 40 is reduced.

To produce the cross section shown in FIG. 3B, nucleation layer 70 is deposited on auxiliary carrier 40. Subsequently, nucleation layer 70 is structured in a photolithography step and an etching step. This is followed by the epitaxial deposition of buffer layer 41 and then semiconductor layer sequence 14.

Figure 3C:
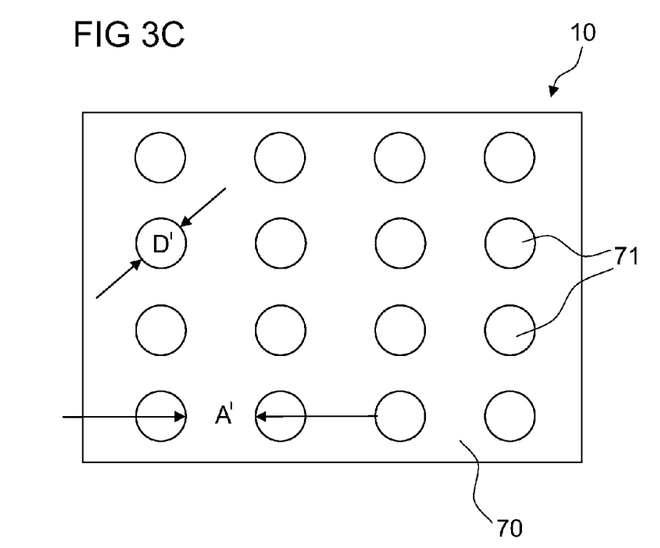

FIG. 3C shows an exemplary embodiment of a cross section through the optoelectronic semiconductor body shown in FIGS. 3A and 3B. The cross section through the nucleation layer 70 is represented in FIG. 3C. Nucleation layer 70 has circular recesses 71. Recesses 71 have a diameter D' from an interval between 10 nm and 3 μm. A typical diameter D' of recesses 71 is 2 μm. A distance A' from one recess 71 to the next recess 71 can have a value from an interval between 20 nm and 10 μm. A typical distance A' has the value 5 μm. The distance A', which is also called "pitch", refers to the distance between one edge of the recess 71 and a closest edge of the closest recess 71.

In alternative embodiments, recesses 71 have hexagonal structures or other geometric structures.

Figure 4A:
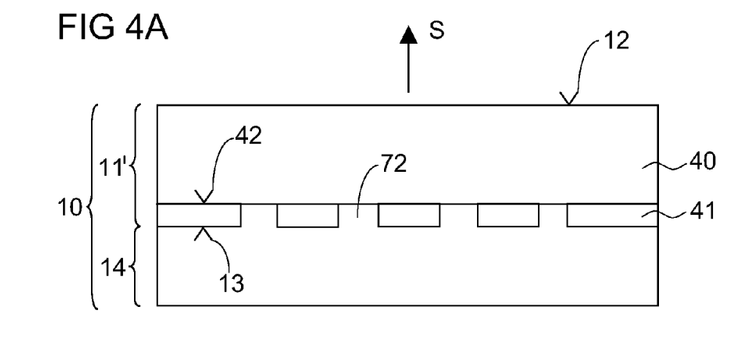
FIGS. 4A-4C show exemplary embodiments of an optoelectronic semiconductor body with a structured buffer layer according to the proposed principle.

FIG. 4A shows an exemplary embodiment of an optoelectronic semiconductor body 10 according to the proposed principle with a structured buffer layer 41. Buffer layer 41 is arranged on first main surface 42 of auxiliary carrier 40. Buffer layer 41 has structures that are formed as recesses 72. Recesses 72 serve to achieve a structuring of buffer layer 41 and thus to perform structured epitaxy. Semiconductor layer sequence 14 is deposited on buffer layer 41 and on auxiliary carrier 40 at the points where buffer layer 41 is removed.

To produce the cross section shown in FIG. 4A, buffer layer 41 is deposited on auxiliary carrier 40. In a photolithography and in an etching step, buffer layer 41 is structured to form recesses 72. Then semiconductor layer sequence 14 is epitaxially deposited. The thickness of buffer layer 41 has a value from the interval between 0.5 μm and 8 μm. A typical value for the thickness of buffer layer 41 is 3 μm.

Figure 4B:
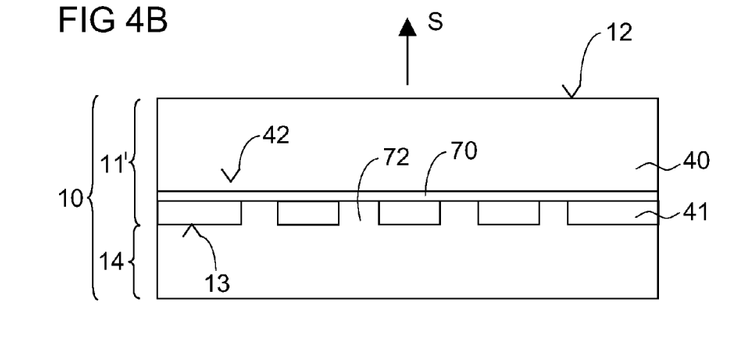

FIG. 4B shows an exemplary embodiment of an optoelectronic semiconductor body that is a refinement of the embodiment shown in FIG. 4A. According to FIG. 4B, substrate 11' additionally includes the nucleation layer 70. Nucleation layer 70 is deposited on first main surface 42 of auxiliary carrier 40. Thus, nucleation layer 70 is situated between auxiliary carrier 40 and buffer layer 41. Semiconductor layer sequence 14 is again deposited on buffer layer 41 or on nucleation layer 70 at the points where buffer layer 41 is structured.

To realize the cross section shown in FIG. 4B, nucleation layer 70 is deposited on auxiliary carrier 40 and then buffer layer 41 is deposited on nucleation layer 70. The deposition process of buffer layer 41 runs epitaxially. Subsequently, buffer layer 41 is structured in a photolithography and an etching step to form recesses 72. Then semiconductor layer sequence 14 is epitaxially deposited.

Figure 4C:
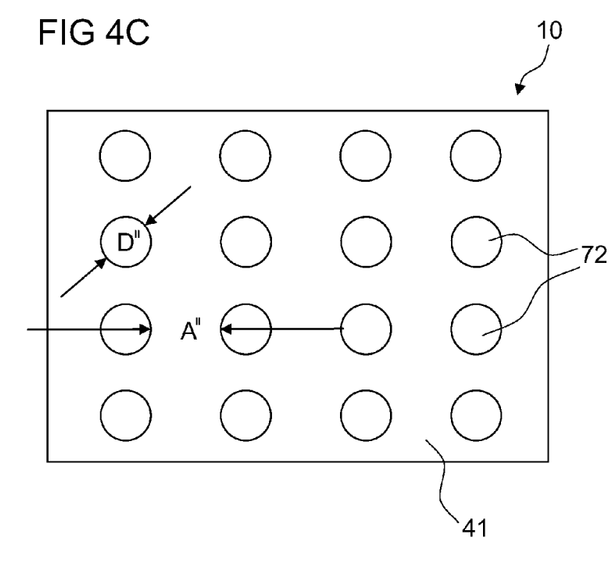

FIG. 4C shows a cross section through the optoelectronic semiconductor body shown in FIG. 4A or 4B. A cross section through buffer layer 41 is shown in FIG. 4C. Buffer layer 41 has circular recesses 72. A diameter D" of recesses 72 has a value from an interval between 80 nm and 3 μm A typical value for the diameter D" of 71 is 2 μm. A distance A" between two recesses has a value from an interval between 120 nm and 10 μm. A typical value for the distance A" is 5 μm.

Figure 5A:
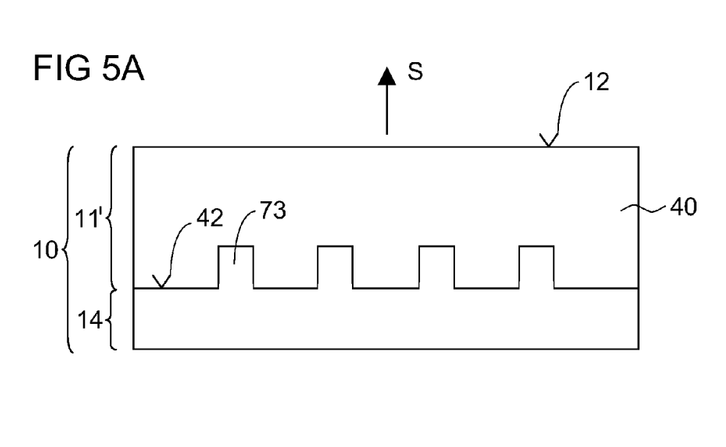
FIGS. 5A-5C show additional exemplary embodiments of an optoelectronic semiconductor body with a structured substrate according to the proposed principle.

FIG. 5A shows an exemplary embodiment of an optoelectronic semiconductor body 10 according to the proposed principle with a structured substrate. Auxiliary carrier 40 of substrate 11' also has structures that are formed as recesses 73. Auxiliary carrier 40 has recesses 73 on first main surface 42. Recesses 73 have a depth from an interval between 10 nm and 2 μm. A typical value for the depths of recesses 73 is 500 nm. Recesses 73 serve to achieve a structuring of auxiliary carrier 40 and thus to perform structured epitaxy. Auxiliary carrier 40 is deposited on semiconductor layer sequence 14. To produce the cross section shown in FIG. 5A, auxiliary carrier 40 is structured by means of a photolithography step and an etching step. Then semiconductor layer sequence 14 is deposited.

Figure 5B:
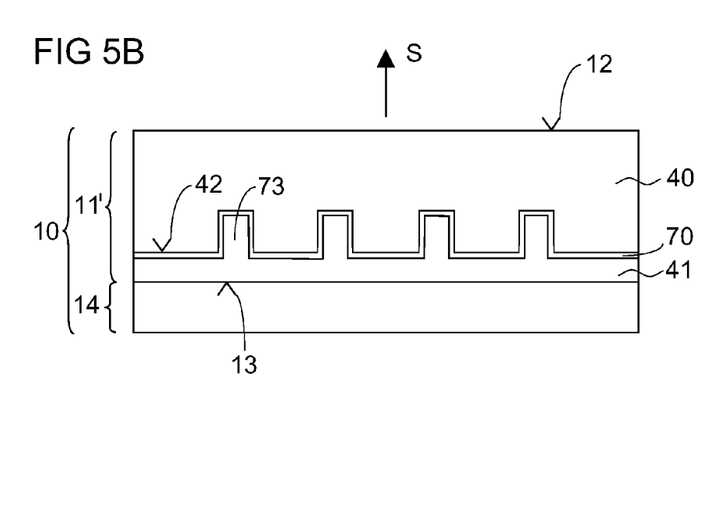

FIG. 5B shows an exemplary embodiment of an optoelectronic semiconductor body 10 which is a refinement of the embodiment shown in FIG. 5A. According to FIG. 5B, substrate 11' includes auxiliary carrier 40, which is structured, nucleation layer 70 as well as buffer layer 41. Nucleation layer 70 is arranged here on auxiliary carrier 40, and buffer layer 41 is arranged on nucleation layer 70.

To realize the cross section shown in FIG. 5B, auxiliary carrier 40 is structured by means of a photolithography step and an etching step to produce recesses 73. Subsequently, nucleation layer 70 is deposited on auxiliary carrier 40 in an epitaxy system. Then buffer layer 41 is deposited epitaxially on nucleation layer 70, and semiconductor layer sequence 14 is deposited epitaxially on buffer layer 41. In one embodiment of the method, the deposition of nucleation layer 70 as well as that of buffer layer 41 and semiconductor layer sequence 14 can be performed without disrupting the vacuum, so that a high quality of the layers is achieved.

In an alternative embodiment (not shown), nucleation layer 70 can be omitted, so that buffer layer 41 is deposited directly on auxiliary carrier 40.

Figure 5C:
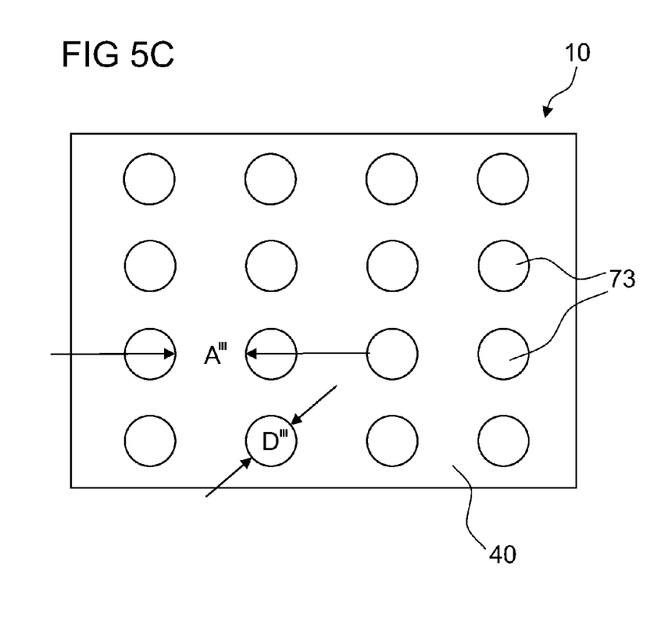

FIG. 5C shows an exemplary embodiment of a cross section through the optoelectronic semiconductor body 10 shown in FIGS. 5A and 5B. A cross section through auxiliary layer 40 is shown. Auxiliary layer 40 has circular recesses 73. Recesses 73 have a diameter D''' from an interval between 80 nm and 3 nm. A typical value for the diameter D''' is 2 μm. A distance A''' between two recesses 73 has a value from an interval between 120 nm and 10 μm. A typical value for the distance A''' is 5 μm.

In alternative embodiments, recesses 73 have hexagonal structures or other geometric structures.

According to FIGS. 3A-3C, 4A-4C and 5A-5C, a waveguide effect between auxiliary carrier 40 and semiconductor layer sequence 14 is reduced because of the structuring of nucleation layer 70 or buffer layer 41 or auxiliary carrier 40. Nucleation layer 70 and/or buffer layer 41 facilitate lattice matching between auxiliary carrier 40 and semiconductor layer sequence 14. The recesses 71 in nucleation layer 70 or the recesses 72 in buffer layer 41 or the recesses 73 in auxiliary carrier 40 are overgrown epitaxially by semiconductor layer sequence 14.

Nucleation layer 70 can be deposited in an epitaxy system. Buffer layer 41 can likewise be deposited in an epitaxy system.

The effect of a photonic crystal can be achieved by means of the structuring of nucleation layer 70, buffer layer 41 or auxiliary carrier 40.

The invention is not limited to the description with reference to embodiments. Rather, the invention includes every characteristic as well as every combination of characteristics, which includes, in particular, every combination of characteristics in the claims, even if this characteristic or this combination itself is not explicitly specified in the claims or exemplary embodiments.

The invention claimed is:

1. An optoelectronic semiconductor body, comprising
a substrate with a front from which electromagnetic radiation is to be emitted;
a semiconductor layer sequence arranged at a rear side of the substrate, the semiconductor layer sequence having an active layer for generating the electromagnetic radiation;
a first and a second electrical connection layer arranged over a first surface of the semiconductor layer sequence that faces away from substrate; and
a mirror arranged on the first surface of the semiconductor layer sequence facing away from the substrate in order to reflect a portion of the electromagnetic radiation generated by the active layer, wherein the minor has at least one recess and the first electrical connection layer has an electrically conductive contact in the at least one recess to the semiconductor layer sequence.

2. The optoelectronic semiconductor body according to claim 1, wherein the substrate and the semiconductor layer sequence contain a nitride compound semiconductor.

3. The optoelectronic semiconductor body according to claim 2, wherein the substrate contains crystalline gallium nitride.

4. The optoelectronic semiconductor body according to claim 1, wherein the substrate comprises an auxiliary carrier arranged at the front of the substrate and wherein the semiconductor layer sequence contains a nitride compound semiconductor arranged on the rear side of the substrate.

5. The optoelectronic semiconductor body according to claim 4, wherein the auxiliary carrier contains crystalline aluminum oxide.

6. The optoelectronic semiconductor body according to claim 4, wherein a first main surface of the auxiliary carrier facing the semiconductor layer sequence comprises a structure.

7. The optoelectronic semiconductor body according to claim 4 wherein the substrate comprises a nucleation layer arranged on a first main surface of the auxiliary carrier facing the semiconductor layer sequence.

8. The optoelectronic semiconductor body according to claim 7, wherein the nucleation layer comprises a structure.

9. The optoelectronic semiconductor body according to claim 4, wherein the substrate comprises a buffer layer arranged over a first main surface of the auxiliary carrier facing the semiconductor layer sequence.

10. The optoelectronic semiconductor body according to claim 9, wherein the buffer layer comprises a structure.

11. The optoelectronic semiconductor body according to claim 1, further comprising an outcoupling structure overlying the front of the substrate,
wherein an emission of the electromagnetic radiation from the front side of the substrate takes place through the outcoupling structure.

12. The optoelectronic semiconductor body according to claim 11, wherein the outcoupling structure comprises a microlens.

13. The optoelectronic semiconductor body according to claim 1, wherein the mirror comprises a dielectric layer and a metal layer.

14. The optoelectronic semiconductor body according to claim 7, wherein the substrate comprises a buffer layer arranged on the nucleation layer.

15. The optoelectronic semiconductor body according to claim 11, wherein the outcoupling structure comprises a diffractive optical element.

16. The optoelectronic semiconductor body according to claim 15, wherein the outcoupling structure comprises a photonic crystal.

17. The optoelectronic semiconductor body according to claim 15, wherein the outcoupling structure comprises a grating.

* * * * *

UNITED STATES PATENT AND TRADEMARK OFFICE
CERTIFICATE OF CORRECTION

PATENT NO.        : 8,362,506 B2  
APPLICATION NO.   : 12/678259  
DATED             : January 29, 2013  
INVENTOR(S)       : Rode et al.

Page 1 of 1

It is certified that error appears in the above-identified patent and that said Letters Patent is hereby corrected as shown below:

In the Claims

In Col. 12, line 7, claim 1, delete "minor" and insert --mirror--.

Signed and Sealed this  
Eleventh Day of June, 2013

Teresa Stanek Rea  
*Acting Director of the United States Patent and Trademark Office*

UNITED STATES PATENT AND TRADEMARK OFFICE
CERTIFICATE OF CORRECTION

PATENT NO. : 8,362,506 B2  Page 1 of 1
APPLICATION NO. : 12/678259
DATED : January 29, 2013
INVENTOR(S) : Rode et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 299 days.

Signed and Sealed this
First Day of September, 2015

Michelle K. Lee
*Director of the United States Patent and Trademark Office*